United States Patent
Nakano et al.

(10) Patent No.: US 6,451,160 B1
(45) Date of Patent: Sep. 17, 2002

(54) PLASMA GENERATION APPARATUS WITH A CONDUCTIVE CONNECTION MEMBER THAT ELECTRICALLY CONNECTS THE POWER SOURCE TO THE ELECTRODE

(75) Inventors: Takanori Nakano, Nabari; Hiroshi Taniguchi, Nara, both of (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/520,612

(22) Filed: Mar. 7, 2000

(30) Foreign Application Priority Data

Mar. 12, 1999 (JP) .......................................... 11-066177

(51) Int. Cl.$^7$ ............................................. H01L 21/00
(52) U.S. Cl. ............................. 156/345.43; 118/723 E; 118/723 R
(58) Field of Search ..................... 118/723 R, 723 E; 156/345, 345.43

(56) References Cited

U.S. PATENT DOCUMENTS

| | | | |
|---|---|---|---|
| 4,328,258 A | * 5/1982 | Coleman | 427/39 |
| 4,633,811 A | * 1/1987 | Maruyama | 118/723 |
| 5,057,185 A | * 10/1991 | Thomas, III et al. | 156/643 |
| 5,102,523 A | * 4/1992 | Beisswenger et al. | 204/298.33 |
| 5,269,881 A | * 12/1993 | Sekiya et al. | 156/643 |
| 5,556,549 A | * 9/1996 | Patrick et al. | 216/61 |
| 5,609,690 A | * 3/1997 | Watanabe et al. | 118/723 E |
| 5,865,937 A | * 2/1999 | Shan et al. | 156/345 |
| 6,000,360 A | * 12/1999 | Koshimizu | 118/723 E |
| 6,152,071 A | * 11/2000 | Akiyama et al. | 118/723 VE |

OTHER PUBLICATIONS

Japanese Unexamined Patent Publication No. Sho 64(1989)–89316.

* cited by examiner

Primary Examiner—Gregory Mills
Assistant Examiner—A. Michelle Crowell
(74) Attorney, Agent, or Firm—Nixon & Vanderhye P.C.

(57) ABSTRACT

A plasma generation apparatus includes a high-frequency power source section; a reaction container to which a material gas is to be supplied; a pair of electrodes that are provided in the reaction container so as to be opposed to each other to generate plasma in between when supplied with high-frequency power by the high-frequency power source section; a conductive connection member that is part of an outer wall of the reaction container and that has, on one side, at least one power source connecting point that is connected to the high-frequency power source section and has, on the other side, at least one electrode connecting point that is connected to the one of the pair of electrodes; and high-frequency current transmitting means provided in the conductive connection member in the vicinity of the at least one power source connecting point, for adjusting impedance between the at least one power source connecting point and the at least one electrode connecting point.

16 Claims, 5 Drawing Sheets

PLASMA GENERATION APPARATUS WITH A CONDUCTIVE CONNECTION MEMBER THAT ELECTRICALLY CONNECTS THE POWER SOURCE TO THE ELECTRODE

CROSS-REFERENCE TO RELATED APPLICATION

This application is related to Japanese Patent Application No. Hei 11(1999)-039578 filed on Feb. 18, 1999, whose priority is claimed under 35 USC §119, the disclosure of which is incorporated by reference in its entirety.

BACKGROUND OF THE INVENTION

1. Field of the Invention

The present invention relates to a plasma generation apparatus and method for manufacture of a functional thin film of a semiconductor or the like by plasma-enhanced chemical vapor deposition. In particular, the invention relates to apparatuses for performing plasma-enhanced chemical evaporation of or plasma etching on a semiconductor thin film such as a hydrogenated amorphous silicon thin film or an insulating film with high-frequency plasma enhancement.

2. Description of the Related Art

The plasma-enhanced chemical vapor deposition (CVD) that forms a semiconductor film by using plasma is widely employed in manufacturing electronic devices such as integrated circuits, liquid crystal displays, and solar panels. A general method of plasma-enhanced CVD will be described with reference to FIG. 8.

Electrically insulated conductive plates 102 and 103 are provided in a vacuum container 101 as electrodes that are opposed to each other. High-frequency power having a frequency of 13.56 MHz, for example, is supplied from a plasma generation power source 104 via an adjustment circuit 105. When a high-frequency voltage is applied to the electrode 102, glow discharge occurs between the electrode 102 and the ground-potential electrode 103, whereby plasma is generated between the electrodes 102 and 103. A material gas G that is caused to flow between the electrodes 102 and 103 is dissociated. With the presence of the dissociated material gas G, a semiconductor film is formed on a substrate S that is mounted on the electrode 103.

In recent years, to increase the film forming rate by increasing the plasma density and to form a high-quality film by reducing the degree of ion damage of films by decreasing the ion sheath voltage, apparatuses have been developed that use a power source of higher frequency bands, in particular, an RF band (13.56 MHz), a VHF band (tens of megahertz), and a UHF band (hundreds of megahertz). In particular, it has already been reported that satisfactory film formation can be attained by a method in which plasma CVD is performed by using small-area electrodes and applying high-frequency power of a VHF band.

Further, in recent years, functional thin films measuring about 1 meter have come to be desired for electronic devices such as liquid crystal displays and amorphous solar panels and attempts to develop a large-area film forming technique using the above manufacturing method have been made. One of the important subjects in attaining the large-area film formation is to develop a technique for forming a film that is uniform in thickness and film quality. An example of such a technique is such that the surface shapes of electrodes are modified so that the electric field strength between the electrodes becomes uniform in the same plane. One factor that relates to a phenomenon that the uniformity of the film thickness and (or) the film quality becomes lower as the film area is increased is a power feeding method for the glow discharge electrode.

In the conventional feeding method for the glow discharge electrode, the skin effect causes supplied high-frequency waves to travel through the surface of the outer wall of a metal reaction container and hence the high-frequency waves are applied to the cathode electrode, for example, from a peripheral portion of the outer wall of the reaction container. This feeding method has problems that the feeding position with respect to the electrode cannot be changed even if the feeding point (power source connecting portion) is changed and that the impedance to the electrode as viewed from the feeding point is large.

A method in which a plurality of contact bodies are interposed between the power source connecting portion and the electrode surface (Japanese Unexamined Patent Publication No. Sho 64(1989)-89316) is known as a method for decreasing the impedance from the power source to the electrode.

Although plasma CVD apparatuses using high-frequency power of a VHF band or a UHF band provide the advantage of improved film quality as mentioned above, they have a problem that the film forming rate and the film quality become non-uniform when those apparatuses are applied to formation of a large-area film. For example, if high-frequency power of VHF or the like is used in a large-area film forming apparatus, the film forming rate at an electrode peripheral portion is much smaller than at an electrode central portion.

Non-uniformity in film forming rate in the electrode plane and resulting non-uniformity in film quality lead to reduction in the characteristics of an amorphous silicon solar panel, for example, and hence they are serious problems in film forming apparatuses for solar panels. It is generally known that the non-uniformity in film forming rate is due to a non-uniform in-plane profile of the electric field strength between the electrodes and that the electric field strength profile in the electrode plane becomes less uniform as the wavelength of high-frequency waves applied approaches the electrode length. As the electric field strength profile becomes less uniform, a variation occurs in the plasma density profile and the radical density profile and hence in the film forming rate profile. In plasma etching apparatuses, a variation similarly occurs in the profile of the electric field strength between the electrodes, which causes a problem that the etching rate varies.

On the other hand, the method of the above-mentioned publication No. Sho 64(1989)-89316 has been proposed to make the in-plane profile of the high-frequency electric field strength uniform. However, this method cannot decrease the impedance to a large extent because of the skin effect. In particular, when high-frequency power of a VHF band or a UHF band is used, the impedance becomes large and the profile of the electric field strength between the electrodes becomes non-uniform.

SUMMARY OF THE INVENTION

The present invention has been made to solve the above problems in the art, and an object of the invention is therefore to provide a plasma generation apparatus and method capable of making the film forming rate and the film quality uniform by preventing the impedance from becoming unduly large and thereby making the profile of the high-frequency electric field strength in the electrode plane uniform even in a case where in a semiconductor film forming apparatus or the like the frequency of power supplied to an electrode is increased to improve the film quality to such an extent that the electrode length is no longer negligible with respect to the wavelength of high-frequency waves.

According to the present invention, there is provided a plasma generation apparatus comprising: a high-frequency power source section; a reaction container to which a material gas is to be supplied; a pair of electrodes that are provided in the reaction container so as to be opposed to each other to generate plasma in between when supplied with high-frequency power by the high-frequency power source section; a conductive connection member that is part of an outer wall of the reaction container and that has, on one side, at least one power source connecting point that is connected to the high-frequency power source section and has, on the other side, at least one electrode connecting point that is connected to the one of the pair of electrodes; and high-frequency current transmitting means provided in the conductive connection member in the vicinity of the at least one power source connecting point, for adjusting impedance between the at least one power source connecting point and the at least one electrode connecting point.

That is, the high-frequency power source section is connected to one of the electrodes (e.g., a cathode electrode) via the conductive connection member that is part of the outer wall of the reaction container, and the high-frequency current transmitting means for adjusting the impedance is provided in the conductive connection member. Therefore, high-frequency current is transmitted from the power source connecting points to the electrode connecting points via the high-frequency current transmitting means. This prevents increase of the high-frequency current propagation path length and concentration of propagation paths that are associated with the skin effect, that is, a phenomenon that as the frequency increases high-frequency current propagates the surface and its vicinity of a conductor (in this case, the conductive connection member) more selectively.

According to a specific embodiment of the invention for improving the high-frequency current propagation paths, the conductive connection member is a conductive plate having the power source connecting points on the outside surface and the electrode connecting points on the inside surface, and the high-frequency current transmitting means is through-holes that penetrate the conductive plate in the inside-outside direction. With this structure, high-frequency current that is supplied to the power source connecting points formed in the vicinity of the respective through-holes are transmitted to the electrode connecting points in such a manner as to selectively propagate through the surfaces of the through-holes and their vicinities. Therefore, the impedance of the conductive connection member can be reduced.

Therefore, the through-holes of the conductive connection member can prevent the electric field strength from decreasing at portions on the periphery of the electrode connecting points that are distant from the power source connecting points and the uniformity of the electric field strength can be made higher. As a result, when a film is formed by placing a subject substrate between the electrodes, the film forming rate profile and the film quality profile in the electrode plane formed by the pair of electrodes can be given sufficient levels of uniformity.

Further, the frequency of high-frequency power supplied can be increased. Even where the electrode length is relatively so long as not to be negligible with respect to the wavelength of a high-frequency electric field, a sufficient level of uniformity of the electric field strength is secured. High-frequency electromagnetic waves of a VHF band or a UHF band can be used for plasma CVD. This makes it possible to utilize the advantages of plasma CVD and plasma etching that use high-frequency electromagnetic waves, such as an increased film forming rate by virtue of an increased plasma density and reduced ion damage by virtue of a decreased ion sheath voltage.

In the invention, it is preferable that not only the power source connecting points but also the electrode connecting points be provided in the vicinity of the high-frequency current transmitting means. There may be provided only one set of a power source connecting point and an electrode connecting point.

However, from the viewpoint of the uniformity of the electric field strength, it is preferable that there be provided plural sets of a power source connecting point and an electrode connecting point.

By inserting an insulative plug in each through-hole, the reaction container can be kept airtight.

Each of the through-holes according to the invention may assume a circle, a polygon, a rectangle, or a combination of any of those.

By forming the through-holes in such a manner that the diameter of an area-equivalent circle is larger than 1 mm and smaller than the interval between adjacent ones of the through-holes, the plasma generation apparatus can be used for plasma CVD using high-frequency waves of a VHF band or a UHF band. The diameter of an area-equivalent circle, which is the diameter of a circle having the same area as the area of a through-hole, is used here to define the size of a through-hole, because through-holes having various shapes are covered by the invention.

It is preferable that the interval between the through-holes be shorter than a half of the wavelength of high-frequency power supplied. This makes it possible to improve the film quality by increasing the frequency of high-frequency power. Even where the length of the pair of electrodes is so long as not to be negligible with respect to the wavelength, the number of power source connecting points can be increased by shortening the interval between the through-holes, whereby the in-plane profile of the high-frequency electric field strength can be made uniform and the film forming rate and the film quality can thereby be made uniform in the electrode plane.

By providing each through-hole with a gas supply inlet through which a material gas is supplied to the reaction container, a material gas can be supplied to the space between the electrodes at a higher level of uniformity. A specific example is such that a gas supply inlet penetrates an insulative plug that is inserted in each through-hole. By supplying a larger amount of material gas through through-holes corresponding to electrode portions where the film forming rate would otherwise be low, the degree of dissociation of the material gas by plasma at those portions can be increased, whereby the film forming rate can be increased there and its in-plane uniformity can be made higher. This is particularly effective in a plasma-enhanced chemical evaporation apparatus that performs chemical evaporation on a substrate by using a material gas supplied to the reaction container.

By providing the high-frequency power source section with an adjustment circuit that supplies different amounts of power to the respective power source connecting points, the problem of reduction of the film forming rate at an electrode peripheral portion can be solved. Specifically, by inputting, via the conductive connection member, larger power to electrode connecting points corresponding to electrode portions where the film forming rate would otherwise be low than to other electrode connecting points, the uniformity of the electric field strength can be made higher and hence the film forming rate and the film quality can be given a sufficient level of uniformity. A specific example of the adjustment circuit is a circuit in which a variable capacitor is provided between the power source and the ground and a series connection of a coil and a variable capacitor is provided between the power source and each electrode connecting point.

By forming the high-frequency power source section so that it supplies high-frequency waves having a frequency of 20–200 MHz to the one of the electrodes, the film forming rate can be increased by virtue of an increased plasma density and ion damage to the formed film can be reduced by virtue of a decreased ion sheath voltage. These make it possible to form what is called a high-quality a —Si:H film that exhibits a large ratio of the light conductivity to the dark conductivity and has a small density of defects in the film. This is particularly effective in a plasma-enhanced chemical evaporation apparatus that is used to form semiconductor thin films for solar panels.

The plasma generation apparatus according to the invention can be constructed as a plasma-enhanced chemical evaporation apparatus that performs chemical evaporation on a substrate by using a material gas supplied to the reaction container or a plasma etching apparatus that performs etching on a substrate.

In this case, as described above, the film forming rate by chemical evaporation or the etching rate can be increased and its in-plane uniformity can be made higher, whereby the advantages of plasma CVD or plasma etching can fully be utilized.

According to the present invention, there is provided a plasma generation method comprising the steps of: preparing a high-frequency power source section, a reaction container to which a material gas is to be supplied, a pair of electrodes that are provided in the reaction container so as to be opposed to each other to generate plasma in between when supplied with high-frequency power by the high-frequency power source section, and a conductive connection member that is part of an outer wall of the reaction container and that has, on one side, at least one power source connecting point that is connected to the high-frequency power source section and has, on the other side, at least one electrode connecting point that is connected to the one of the pair of electrodes; and supplying the high-frequency power from the high-frequency power source section to the pair of electrodes via high-frequency current transmitting means provided in the conductive connection member in the vicinity of the at least one power source connecting point, for adjusting impedance between the at least one power source connecting point and the at least one electrode connecting point.

DETAILED DESCRIPTION OF THE PREFERRED EMBODIMENTS

Plasma generation apparatuses according to embodiments of the present invention will be hereinafter described.
Embodiment 1

Figure 1:
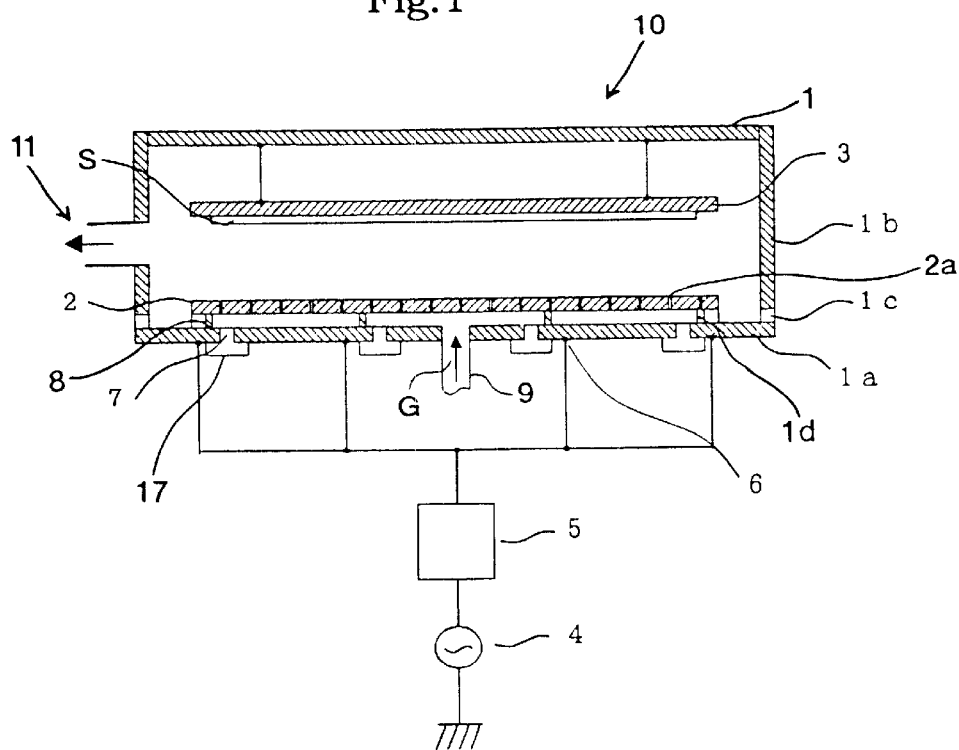
FIG. 1 is a front sectional view of a reaction container of a high-frequency plasma CVD apparatus according to a first embodiment of the present invention.
Figure 2:
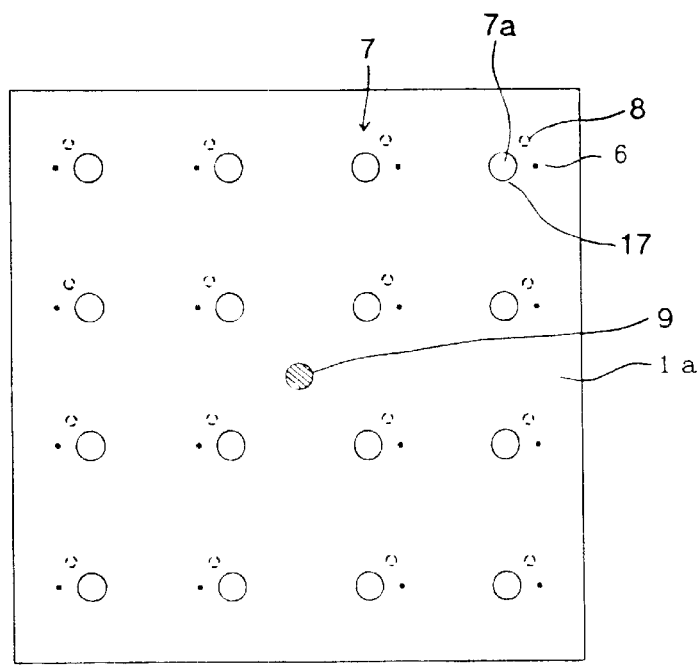
FIG. 2 is a plan view showing power source connecting points, electrode connecting points, and through-holes that are formed on the outer wall of the container shown in FIG. 1.
Figure 3:
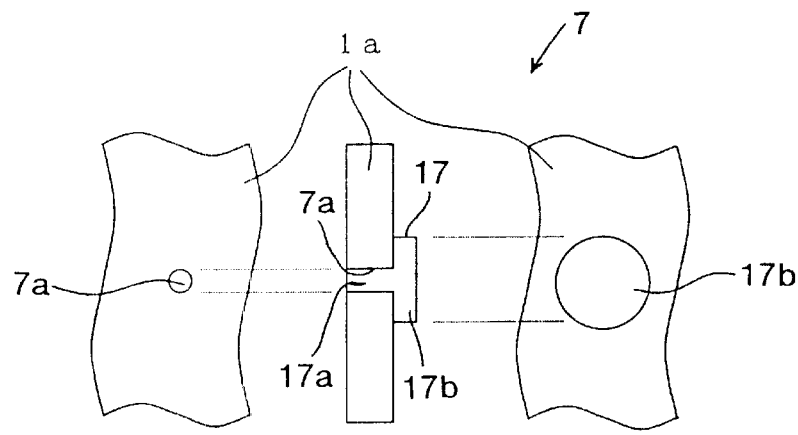
FIG. 3 is an enlarged three-view diagram showing part of the container outer wall on which the through-holes shown in FIG. 2 are formed.

An in-line high-frequency plasma CVD system according to a first embodiment of the invention which enables large-area film formation will be described with reference to FIGS. 1–3. A high-frequency plasma CVD apparatus 10 is one of reaction chambers of the in-line plasma CVD system. Processes for forming semiconductor thin films of an electronic device are sequentially executed in the respective reaction chambers. FIG. 1 is a schematic vertical sectional view of the reaction container. FIG. 2 is a plan view of the bottom surface of the outer wall of the reaction container. FIG. 3 is a three-view diagram showing part of the outer wall shown in FIG. 2.

The plasma CVD apparatus 10 is mainly composed of a reaction container 1 that is supplied with a material gas G, a cathode electrode 2 and an anode electrode 3 that are provided in the reaction container 1 so as to be opposed to each other, a high-frequency power source 4, and an adjustment circuit 5.

The reaction container 1 is composed of a bottom plate portion 1a as a conductive connection member that supports the cathode electrode 2 and connects it to the high-frequency power source 4, and a container top portion 1b that grounds and supports the anode electrode 3. One side of the bottom plate portion 1a is connected to the high-frequency power source 4 via a plurality of power source connecting points 6, and the other side is connected to the cathode electrode 2 via a plurality of electrode connecting points 8 and conductors 1d. An outlet 11 is formed in the outer wall of the reaction container 1.

The cathode electrode 2 is of an external type in which the cathode electrode 2 is supplied with power from the bottom plate portion 1a, and is a square conductive electrode plate whose sides measure 1 m. Gas-spouting minute holes penetrate the cathode electrode 2 in the inside-outside direction.

The anode electrode 3, which is a square conductive electrode plate whose sides measure 1 m, is disposed at a position distant from the cathode electrode 2 by 25 mm. The anode electrode 3 has, on the surface, a substrate supporting means (not shown) for supporting a substrate S that is a member to be processed. The substrate S is a square glass or metal substrate whose sides measure 900 mm.

As shown in FIG. 2, the bottom plate portion 1a is a plate-like member having a thickness of about 15 mm and is made of stainless steel. The bottom plate portion 1a has the power source connecting points 6 and the electrode connecting points 8 on the outside surface and the inside surface, respectively. The bottom plate portion 1a also has a plurality of through-hole portions 7 each being composed of a through-hole 7a that penetrates the bottom plate portion 1a in the inside-outside direction and an insulative plug 17 that is inserted in the through-hole 7a. The through-hole portions 7 are formed in circles of 20 mm in diameter and are located in the vicinity of the respective power source connecting points 6 and electrode connecting points 8 to adjust the high-frequency impedance. The through-hole portions 7 are arranged in matrix form at intervals of 250 mm in both directions.

As shown in FIG. 3, each insulative plug 17 has a trunk portion 17a that is inserted in the associated through-hole 7a and a large-diameter head portion 17b that projects downward from the bottom plate portion 1a. Being mold products of Teflon (PTFE resin), the insulative plugs 17 seal the reaction container 1 so that the inside of the reaction container 1 is kept in a vacuum state of a prescribed pressure.

The reaction container 1 is connected to a material gas supply section (not shown) that supplies a material gas G to the reaction container 1 through a gas inlet 9. The material gas G passes through the gas-spouting minute holes 2a of the cathode electrode 2 and then flows between the electrodes 2 and 3, whereby the material gas G is dissociated and a semiconductor film is formed on the surface of the substrate S.

The adjustment circuit 5 can distribute high-frequency power having an arbitrary frequency in a range of 20–200 MHz that is generated by the high-frequency power source 4 to the power source connecting points 6 so that arbitrary amounts of power are supplied to the respective power source connecting points 6.

To form a semiconductor film on the surface of a substrate S with the plasma CVD apparatus 10, first the substrate S is placed on the surface of the anode electrode 3 so as to be supported by the anode electrode 3. A material gas G is introduced through the gas inlet 9 and caused to pass through the gas-spouting minute holes 2a of the cathode electrode 2 and flow between the electrodes 2 and 3, and high-frequency power having a prescribed frequency is supplied from the high-frequency power source 4. By generating plasma by applying the high-frequency power between the electrodes 2 and 3, the material gas G is dissociated and a semiconductor film is thereby formed on the substrate S.

[Experiment 1]

Amorphous silicon thin films were formed by using the plasma CVD apparatus 10 and their thickness profiles etc. were measured.

As for the setting of parameters in film forming attempts, the high-frequency power for plasma generation that was applied to the cathode electrode 2 was 0.1 W/cm$^2$ and the pressure inside the reaction container 1 was 0.2 Torr. Silane and hydrogen material gases were supplied to the reaction container 1 as material gases G. The frequency of the high-frequency power was set at three different values. Results are shown in Table 1.

TABLE 1

| Power source frequency (MHz) | 13.56 | 27.12 | 81.36 |
|---|---|---|---|
| (Electrode dimension)/(Electromagnetic wave wavelength) | 1/24 | 1/12 | 1/4 |

TABLE 1-continued

| | | | |
|---|---|---|---|
| Film thickness variation (%) | ±3 | ±6 | ±8 |
| Film forming rate (Å/s) | 5.0 | 10.0 | 16.0 |
| (Light conductivity)/(Dark conductivity) | $6.0 \times 10^4$ | $5.0 \times 10^5$ | $3.0 \times 10^6$ |
| Density of defects in film (cm$^{-3}$) | $3.0 \times 10^{15}$ | $1.0 \times 10^{15}$ | $6.0 \times 10^{14}$ |

As seen from Table 1, even where the length of the electrodes 2 and 3 is so long as not to be negligible with respect to the wavelength of high-frequency waves, the non-uniformity of the film thickness profile is kept lower than a certain level and the profile of the electric field strength between the electrodes 2 and 3 is made uniform. As the frequency increases, the film forming rate increases, the ratio of the light conductivity to the dark conductivity of a semiconductor thin film increases relatively, and the density defects in a film decreases. Therefore, it is understood that the film forming rate is increased and the film quality is improved.

Embodiment 2

Figure 4:
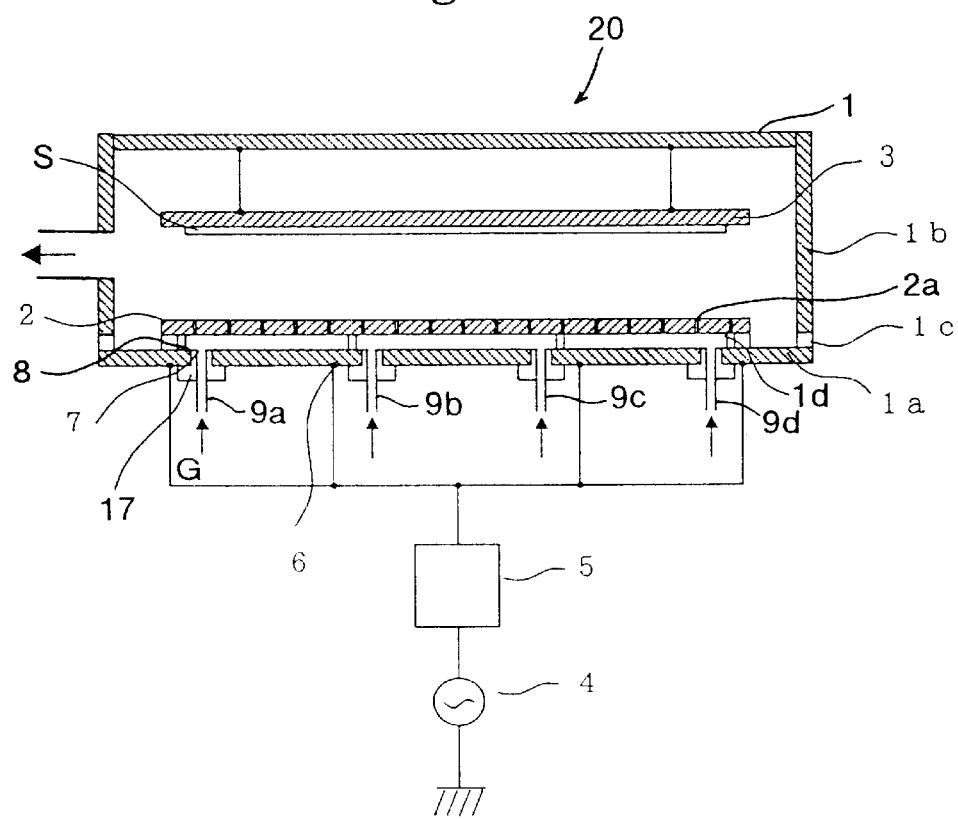
FIG. 4 is a front sectional view of a reaction container of a high-frequency plasma CVD apparatus according to a second embodiment of the invention.

FIG. 4 shows a high-frequency plasma CVD apparatus 20 according to a second embodiment of the invention which enables large-area film formation. The high-frequency plasma CVD apparatus 20 has generally the same configuration as the high-frequency plasma CVD apparatus 10 according to the first embodiment and the former is different from the latter in the method for supplying a material gas G.

Specifically, whereas in the first embodiment a material gas G is introduced into the reaction container 1 through the single gas inlet 9, in the second embodiment a material gas G is introduced into the reaction container 1 through a plurality of inlets 9a–9d. In this embodiment, a material gas G that is supplied from the material gas supply means (not shown) is introduced into the reaction container 1 through the inlets 9a–9d, passes through the gas-spouting minute holes 2a of the cathode electrode 2, and flows between the electrodes 2 and 3. Each of the inlets 9a–9d is formed as a through-hole portion 7 which penetrates an insulative plug 17 in the inside-outside direction. When the reaction container 1 is evacuated, the insulative plugs 17 and the inlets 9a–9d keep the reaction container 1 airtight. The supply amounts of a material gas G through the respective inlets 9a–9d may be set equal to each other or may be adjusted so as to be different from each other.

[Experiment 2]

Amorphous silicon thin films were formed by using the plasma CVD apparatus 20 and their thickness profiles etc. were measured. The supply amounts of a material gas G through the respective inlets 9a–9d were adjusted individually. More specifically, the ratio of the flow rate of a material gas G through the inlets 9b and 9c to that through the inlets 9a and 9d was set at 1:2, whereby the gas flow rate was set higher for a peripheral portion of the electrode 2 where the film forming rate would otherwise be low.

As for the setting of parameters in film forming attempts, the high-frequency power for plasma generation that was applied to the cathode electrode 2 was 0.1 W/cm$^2$ and the pressure inside the reaction container 1 was 0.3 Torr. Silane and hydrogen were supplied to the reaction container 1 as material gases G. The frequency of the high-frequency power was set at three different values. Results are shown in Table 2.

TABLE 2

| Power source frequency (MHz) | 13.56 | 27.12 | 81.36 |
|---|---|---|---|
| (Electrode dimension)/(Electromagnetic wave wavelength) | $1/24$ | $1/12$ | $1/4$ |
| Film thickness variation (%) | ±3 | ±5 | ±6 |
| Film forming rate (Å/s) | 5.2 | 9.6 | 15.0 |
| (Light conductivity)/(Dark conductivity) | $7.0 \times 10^4$ | $4.5 \times 10^5$ | $3.8 \times 10^5$ |
| Density of defects in film (cm$^{-3}$) | $2.5 \times 10^{15}$ | $1.0 \times 10^{15}$ | $7.5 \times 10^{14}$ |

As seen from Table 2, the supply of power using the through-hole portions 7 and the distributed supply of a material gas G improve the thickness profile of a thin film formed. Even where the length of the electrodes 2 and 3 is so long as not to be negligible with respect to the wavelength of high-frequency waves, the non-uniformity of the film thickness profile is kept low and the profile of the electric field strength between the electrodes 2 and 3 is made uniform. As the frequency increases, the film forming rate increases, the ratio of the light conductivity to the dark conductivity of a semiconductor thin film increases relatively, and the density of defects in a film decreases. Therefore, it is understood that the film forming rate is increased and the film quality is improved.

Embodiment 3

Figure 5:
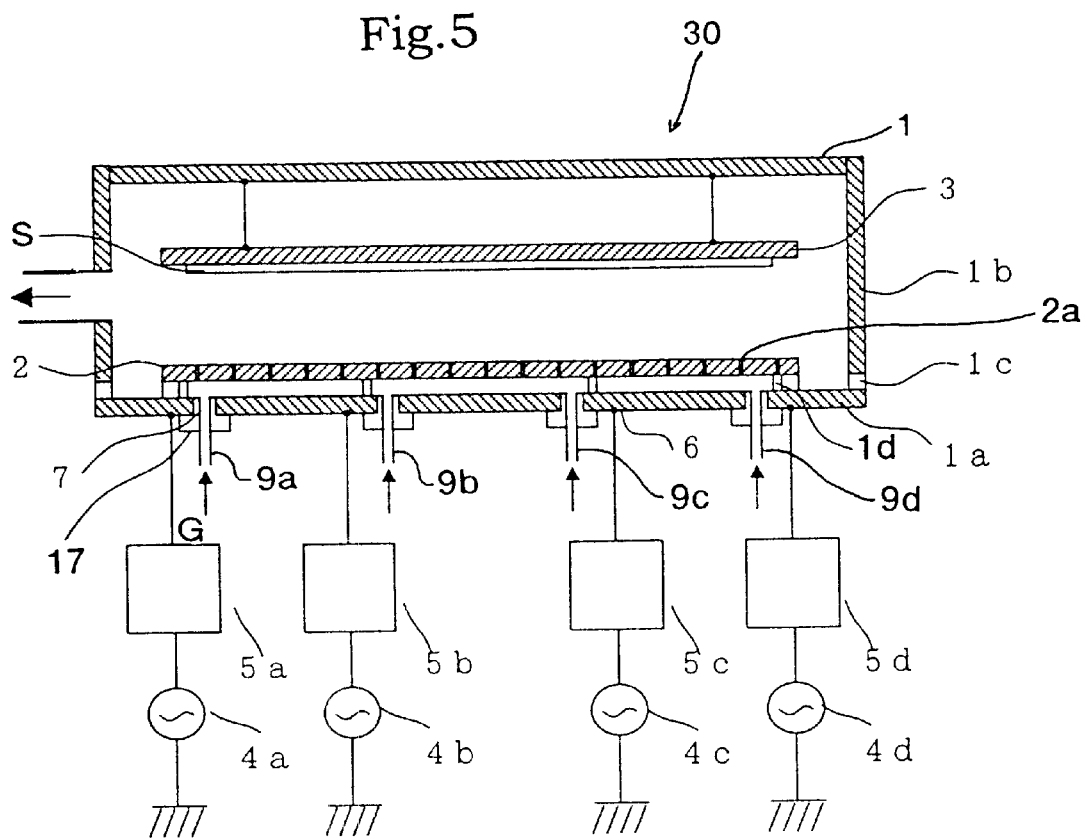
FIG. 5 is a front sectional view of a reaction container of a high-frequency plasma CVD apparatus according to a third embodiment of the invention.

FIG. 5 shows a high-frequency plasma CVD apparatus 30 according to a third embodiment of the invention which enables large-area film formation. The high-frequency plasma CVD apparatus 30 has generally the same configuration as the high-frequency plasma CVD apparatus 20 according to the second embodiment and the former is different from the latter in the method for supplying power to the power source connecting points 6.

Specifically, whereas in the second embodiment high-frequency power is supplied to the power source connecting points 6 from the single set of a high-frequency power source 4 and a adjustment circuit 5, in the third embodiment each power source connecting point 6 is connected to a set of one of independent high-frequency power sources 4 (4a–4d) and one of independent adjustment circuits 5 (5a–5d). The supply amounts of power to the respective power source connecting points 6 may be set equal to each other or may be adjusted so as to be different from each other.

[Experiment 3]

Amorphous silicon thin films were formed by using the plasma CVD apparatus 30 and their thickness profiles etc. were measured. To make the in-plane film forming rate profile uniform, the ratio of the amount of power supplied from the adjustment circuits 5b and 5c to that supplied from the adjustment circuits 5a and 5d (corresponding to a peripheral portion of the electrode 2 where the film forming rate would otherwise be low) was set at 1:2.

As for the setting of parameters in film forming attempts, the high-frequency power for plasma generation that was applied to the cathode electrode 2 was 0.1 W/cm$^2$ and the pressure inside the reaction container 1 was 0.3 Torr. Silane and hydrogen were supplied to the reaction container 1 as material gases G. The frequency of the high-frequency power was set at three different values. Results are shown in Table 3.

TABLE 3

| Power source frequency (MHz) | 13.56 | 27.12 | 81.36 |
|---|---|---|---|
| (Electrode dimension)/(Electromagnetic wave wavelength) | $1/24$ | $1/12$ | $1/4$ |
| Film thickness variation (%) | ±3 | ±4 | ±3 |
| Film forming rate (Å/s) | 5.0 | 10.6 | 15.5 |
| (Light conductivity)/(Dark conductivity) | $3.5 \times 10^4$ | $4.0 \times 10^5$ | $2.8 \times 10^5$ |
| Density of defects in film (cm$^{-3}$) | $2.3 \times 10^{15}$ | $1.5 \times 10^{15}$ | $7.0 \times 10^{14}$ |

As seen from Table 3, the supply of power using the through-hole portions 7, the distributed supply of a material gas G, and the adjustment of the amounts of power supplied to the respective power source connecting points 6 improve the thickness profile of a thin film formed. Even where the length of the electrodes 2 and 3 is so long as not to be negligible with respect to the wavelength of high-frequency waves, the non-uniformity of the film thickness profile is kept low and the profile of the electric field strength between the electrodes 2 and 3 is made uniform. As the frequency increases, the film forming rate increases, the ratio of the light conductivity to the dark conductivity of a semiconductor thin film increases relatively, and the density of defects in a film decreases. Therefore, it is understood that the film forming rate is increased and the film quality is improved.

Other Embodiments

Figure 6:
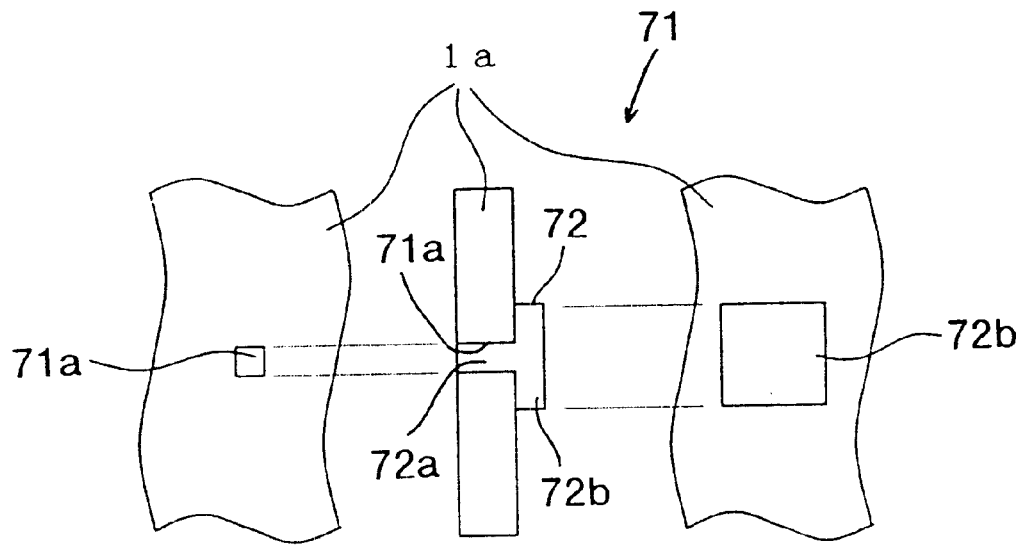
FIG. 6, which corresponds to FIG. 3, shows the structure of a through-hole portion according to another embodiment of the invention.
Figure 7:
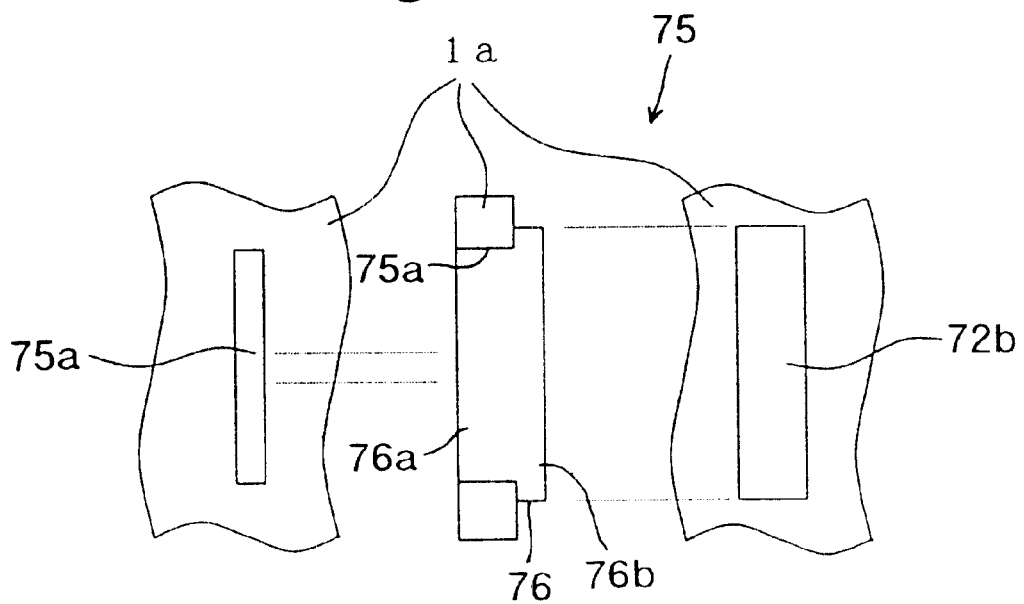
FIG. 7, which corresponds to FIG. 3, shows the structure of a through-hole portion according to still another embodiment of the invention.
Figure 8:
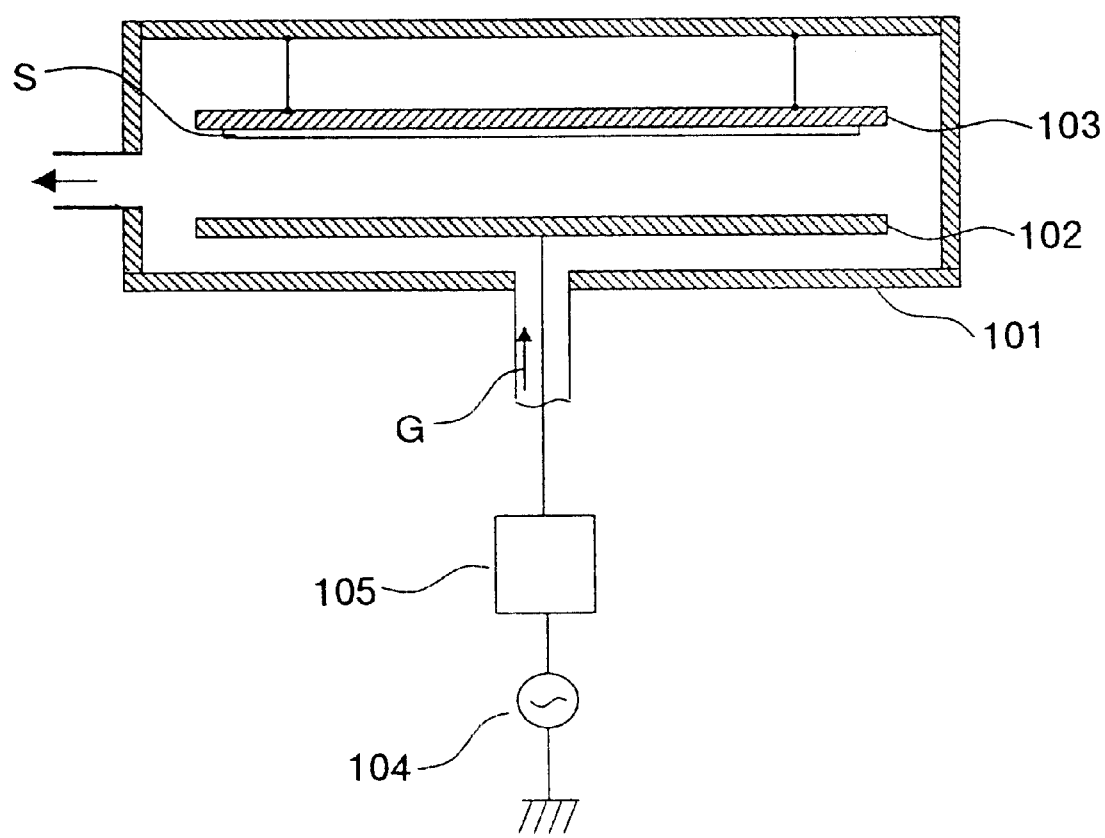
FIG. 8, which corresponds to FIG. 1, shows a conventional high-frequency plasma CVD apparatus.

FIGS. 6 and 7 show the structures of through-hole portions according to other embodiments of the invention.

Whereas these through-hole portions are formed in the bottom plate portion 1a in the vicinity of the respective power source connecting points 6 and electrode connecting points 8 like the through-hole portions 7 according to the first embodiment, they have different shapes than in the first embodiment.

Specifically, as shown in FIG. 6, each through-hole portion 71 has a through-hole 71a and an insulative plug 72 and assume a square whose sides measure 20 mm. Each insulative plug 72 has a trunk portion 72a that is inserted in the associated through-hole 71a and a head portion 72b that projects downward from the bottom plate portion 1a. Being mold products of Teflon (PTFE resin), the insulative plugs 72 seal the reaction container 1 so that the inside of the reaction container 1 is kept in a vacuum state of a prescribed pressure.

On the other hand, as shown in FIG. 7, each through-hole portion 75 has a through-hole 75a and an insulative plug 76 and assume a long and narrow rectangle in which the long sides and the short sides measure 100 mm and 20 mm, respectively. Each insulative plug 76 has a trunk portion 76a that is inserted in the associated through-hole 75a and a rectangle-shaped head portion 76b that projects downward from the bottom plate portion 1a. Being mold products of Teflon (PTFE resin), the insulative plugs 76 seal the reaction container 1 so that the inside of the reaction container 1 is kept in a vacuum state of a prescribed pressure.

In each of the above embodiments, the electric field strength is prevented from decreasing at portions on the periphery of the electrode connecting points 8 that are distant from the respective power source connecting points 6 by the through-hole portions 7 (71, 75) of the bottom plate portion 1a. That is, if the through-hole portions 7 were not provided, high-frequency waves would travel through the surface of the conductor from the power source connecting points 6 to the electrode connecting points 8 by the skin effect. In contrast, where the through-hole portions 7 are provided in the vicinity of the power source connecting points 6 and the electrode connecting points 8, high-frequency waves travel through the side surfaces of the through-holes 7a and hence the high-frequency impedance can be reduced.

In the plasma generation apparatus according to the invention, the high-frequency power source section is connected to one of the electrodes (e.g., a cathode electrode) via the conductive connection member that is part of the outer wall of the reaction container and the high-frequency current transmitting means for adjusting the impedance is provided in the conductive connection member. Therefore, high-frequency current is transmitted from the power source connecting points to the electrode connecting points via the high-frequency current transmitting means. This prevents increase of the high-frequency current propagation path length and concentration of propagation paths that are caused by the skin effect.

Where the high-frequency current transmitting means is through-holes that penetrate a conductive plate in the inside-outside direction, high-frequency current that is supplied to the power source connecting points formed in the vicinity of the respective through-holes are transmitted to the electrode connecting points in such a manner as to selectively propagate through the surfaces of the through-holes and their vicinities. Therefore, the impedance of the conductive connection member can be reduced.

The through-holes of the conductive connection member can prevent the electric field strength from decreasing at portions on the periphery of the electrode connecting points that are distant from the power source connecting points and the uniformity of the electric field strength can be made higher. As a result, when a film is formed by placing a subject substrate between the electrodes, the film forming rate profile and the film quality profile in the electrode plane formed by the pair of electrodes can be given necessary levels of uniformity.

Further, the frequency of high-frequency power to be supplied can be increased. Even where the electrode length is so long as not to be negligible with respect to the wavelength of a high-frequency electric field, the uniformity of the electric field strength is secured. High-frequency electromagnetic waves of a VHF band or a UHF band can be used for plasma CVD. This makes it possible to utilize the advantages of plasma CVD and plasma etching that use high-frequency electromagnetic waves, such as an increased film forming rate by virtue of an increased plasma density and reduced ion damage by virtue of a decreased ion sheath voltage.

By providing each through-hole with a material gas supply inlet and adjusting the individual gas flow rates or by adjusting the amounts of power to be supplied to the respective feeding points (power source connecting points), the film forming rate, the film quality, or the etching rate can be given a sufficient level of in-plane uniformity. This is particularly effective in securing a sufficient level of in-plane uniformity of the film forming rate, the film quality, or the etching rate when it is intended to increase the frequency of power for plasma generation to improve the film quality and increase the processing speed in a film forming apparatus or an etching apparatus for a large-area device such as a solar panel or a liquid crystal displays.

What is claimed is:

1. A plasma generation apparatus comprising:
   a high-frequency power source section;
   a reaction container to which a material gas is to be supplied;
   a pair of electrodes that are provided in the reaction container so as to be opposed to each other to generate plasma therebetween when supplied with high-frequency power by the high-frequency power source section;
   a conductive connection member that is part of an outer wall of the reaction container and that has, on one side, at least one power source connecting point that is electrically connected to the high-frequency power source section and has, on the other side, at least one electrode connecting point that is electrically connected to the one of the pair of electrodes, said conductive connection member being part of a circuit for electrically connecting the power source to the one electrode so that current from the power source flows through the conductive connection member en route to the one electrode; and
   high-frequency current transmitting means provided in the conductive connection member in the vicinity of the at least one power source connecting point, said high-frequency current transmitting means including at least one through hole provided in the conductive connection member for adjusting impedance between the at least one power source connecting point and the at least one electrode connecting point.

2. The plasma generation apparatus according to claim 1, wherein the conductive connection member is a conductive plate having the at least one power source connecting point on an outside surface thereof and the at least one electrode connecting point on an inside surface thereof, and wherein the at least one through-hole penetrates the conductive plate in an inside-outside direction.

3. The plasma generation apparatus according to claim 2, wherein the high-frequency current transmitting means further comprises an insulative plug that is inserted in each of the at least one through-hole.

4. The plasma generation apparatus according to claim 2, wherein the at least one through-hole assumes a circle, a polygon, a rectangle, or a shape that is a combination of any of a circle, a polygon, and a rectangle.

5. The plasma generation apparatus according to claim 2, wherein a diameter of an area-equivalent circle of the at least one through-hole is larger than 1 mm and smaller than an interval between adjacent ones of the at least one through-hole.

6. The plasma generation apparatus according to claim 2, wherein a plurality of said through holes are provided in the conductive plate and an interval between the through-holes is shorter than a half of a wavelength of the high-frequency power that is supplied from the high-frequency power source section.

7. The plasma generation apparatus according to claim 2, wherein the at least one through-hole comprises a gas supply inlet through which the material gas is supplied to the reaction container.

8. The plasma generation apparatus according to claim 7, wherein the gas supply inlet is a hole that penetrates an insulative plug that is inserted in the at least one through-hole.

9. The plasma generation apparatus according to claim 1, wherein the high-frequency power source section comprises an adjustment circuit for supplying different amounts of power to each of the at least one power source connecting point, respectively.

10. The plasma generation apparatus according to claim 1, wherein the high-frequency power source section is so configured as to supply the high-frequency power having a frequency of 20–200 MHz to the one of the pair of electrodes.

11. The plasma generation apparatus according to claim 1, wherein the plasma generation apparatus is a plasma-enhanced chemical evaporation apparatus that performs chemical evaporation on a substrate by using the material gas supplied to the reaction container.

12. The plasma generation apparatus according to claim 1, wherein the plasma generation apparatus is a plasma etching apparatus that performs etching on a substrate by using the material gas supplied to the reaction container.

13. A plasma generation apparatus comprising:

a power source;

a reaction container to which a material gas is to be supplied;

a pair of electrodes provided in the reaction container so as to be opposed to each other to generate a plasma therebetween when supplied with power by the power source;

a conductive connection member for electrically connecting the power source to one of said electrodes so that current from the power source flows through the conductive connection member en route to said one electrode, said conductive connection member including at least one power source connecting point for electrical connection to the power source section and at least one electrode connecting point for electrical connection to said one electrode; and wherein said conductive connection member includes at least one through-hole defined therein in a vicinity of the at least one power source connecting point for adjusting impedance between the at least one power source connecting point and the at least one electrode connecting point.

14. The plasma generation apparatus of claim 13, wherein the conductive connection member comprises a conductive plate with a plurality of the through holes provided therein.

15. The plasma generation apparatus of claim 13, further comprising an insulating plug provided in the through hole.

16. The plasma generation apparatus of claim 13, wherein the gas in input into the container via the through hole.

* * * * *